United States Patent [19]
Doan et al.

[11] Patent Number: 5,372,974
[45] Date of Patent: Dec. 13, 1994

[54] APPROACH TO AVOID BUCKLING IN BPSG BY USING AN INTERMEDIATE BARRIER LAYER

[75] Inventors: Trung T. Doan; Randhir P. S. Thakur; Yauh-Ching Liu, all of Boise, Id.

[73] Assignee: Micron Semiconductor, Inc., Boise, Id.

[21] Appl. No.: 34,339

[22] Filed: Mar. 19, 1993

[51] Int. Cl.$^5$ ............................... H01L 21/02
[52] U.S. Cl. ............................... 437/240; 437/173; 437/942
[58] Field of Search ............... 437/173, 942, 943, 190, 437/240

[56] References Cited

U.S. PATENT DOCUMENTS

| | | | |
|---|---|---|---|
| 4,870,031 | 9/1989 | Sugahara et al. | 437/82 |
| 5,284,804 | 2/1994 | Moslehi | 437/240 |

FOREIGN PATENT DOCUMENTS 0032732  4/1981  Japan ........................... 437/240

OTHER PUBLICATIONS

Wolf et al., vol. I, Silicon Processing for the VLSI Era, Lattice Press, 1986 pp. 188-191.

Primary Examiner—Brian E. Hearn
Assistant Examiner—Lynne A. Gurley
Attorney, Agent, or Firm—Lia M. Pappas

[57] ABSTRACT

A method for reducing the effects of buckling, cracking, or wrinkling in multilayer heterostructures is provided. The method involves forming a planarization layer superjacent a semiconductor substrate. A barrier film having a structural integrity is formed superjacent the planarization layer by exposing the substrate to a gas and radiant energy. A second layer is formed superjacent the barrier film. The substrate is heated to cause the planarization layer to expand according to a first thermal coefficient of expansion, the second layer to expand according to a second thermal coefficient of expansion, and the structural integrity of the barrier film to be maintained. This results in the barrier film isolating the planarization layer from the second layer, thereby preventing the planarization layer and the second layer from interacting during the heating step. Further, it enables the planarization layer to go through a solid state reaction and the second layer to obtain a uniform reflow.

18 Claims, 7 Drawing Sheets

(KNOWN ART)

(KNOWN ART)

(KNOWN ART)

(KNOWN ART)

(KNOWN ART)

APPROACH TO AVOID BUCKLING IN BPSG BY USING AN INTERMEDIATE BARRIER LAYER

BACKGROUND OF THE INVENTION

The present invention relates to a method and a structure for reducing the effects of buckling in fabricating semiconductor wafers.

FIELD OF THE INVENTION

One pronounced goal in the semiconductor industry is high device yields. To achieve this end, it is essential to employ a flat semiconductor wafer. If the process steps involved in semiconductor fabrication are performed on a non-uniform wafer surface, various problems may arise resulting in a substantial number of inoperable devices and, thus, a low yield.

Previous methods used to ensure the wafer surface planarity have included forming an oxide such as Boro-PhosphoSilicate Glass ("BPSG") layer on the wafer surface. These methods have then employed a heating step, as applied to the wafer, to reflow and planarize the oxide layer. However, this "reflow" method of planarizing the wafer surface is substantially limited in light of large device geometries and thermal budgets because of the buckling, also referred to as cracking or wrinkling, of multilayer heterostructures.

Buckling of layers in the manufacture of semiconductor wafers pertains to the relationship between a heterostructures disposed upon each other. This relationship is depicted in FIG. 1 where a first layer 10, comprising a semiconductor substrate for example, is illustrated having a second layer 20 positioned superjacent. Unfortunately, first layer 10 and second layer 20 both have different thermal expansion coefficients. As such, first layer 10 expands at a rate inherent to the characteristics of its chemical composition during reflow, while the second layer, comprising a different chemical composition than the first layer, expands at an entirely different rate.

This buckling effect is illustrated in FIGS. 2 and 3. FIG. 2 provides a cross-sectional perspective of a buckled semiconductor substrate. FIG. 3 depicts a top view of a buckled semiconductor substrate as obtained using Atomic Forced Microscopy (AFM). In view of both Figures, the distance between a high point and low point is on the order of one micron. With the top surface of the substrate distorted by the effects of buckling, later stages in the fabrication process of the semiconductor device are substantially impacted. For example, during a subsequent etch, an implanted dopant positioned underneath the low point of the distortion may be unintentionally removed or inadvertently allowed to interact with other compounds.

Another method which has been used to produce a planar wafer surface is to use the oxide reflow method described above, in conjunction with spin coating the wafer with photoresist. The spin coating fills the low points on the wafer surface, thereby producing a planar surface. Next, a dry etch, which removes photoresist and oxide at a rate sufficiently close to 1:1, etches the photoresist and the high points on the wafer surface, thereby producing a planar oxide layer on the wafer surface.

Irrespective of either method for providing a planar surface, the buckling of layers still develops during the step of reflow because of the materials employed and their different thermal expansion coefficients. As such, with technology enabling the development of smaller and smaller device feature sizes, a new process is needed to circumvent the debilitating effects of buckling.

SUMMARY OF THE INVENTION

One object of the present invention is to provide a method for reducing the effects of buckling in fabricating a semiconductor wafer.

A further object of the present invention is to provide a semiconductor device impervious to the effects of buckling.

Still another object of the present invention is to provide a method which enables a uniform reflow of layers involved in the fabrication of semiconductors.

Yet another object of the present invention is to provide a semiconductor device which allows for the uniform reflow of layers in the fabrication of the device.

Another object of the present invention is to activate or modify the characteristics of a layer as a function of thermal budget and chemical reaction.

In order to achieve the hereinabove objects, as well as others which will become apparent hereafter, a method is disclosed for reducing the effects of buckling, also referred to as cracking or wrinkling in multilayer heterostructures. The first step of the present method involves forming a planarization layer superjacent a semiconductor substrate. The planarization layer comprises tungsten, titanium, tantalum, copper, aluminum, single crystal silicon, polycrystalline silicon, amorphous silicon, borophosphosilicate glass ("BPSG") or tetraethylorthosilicate ("TEOS"). Next, a barrier film having a structural integrity is formed superjacent said planarization layer by exposing said substrate to a gas and radiant energy. The gas comprises a reactive or inert gas or mixture thereof, including at least one of $N_2$, $NH_3$, $O_2$, $N_2O$, Ar, Ar—$H_2$, $H_2$, $GeH_4$, and a Fluorine based gas, while the radiant energy generates heat within the range of 500° C. to 1250° C. Subsequently, a second layer is formed superjacent the barrier film. The second layer comprises tungsten, titanium, tantalum, copper, aluminum, single crystal silicon, polycrystalline silicon, amorphous silicon, borophosphosilicate glass ("BPSG") or tetraethylorthosilicate ("TEOS"). Finally, the substrate is heated a temperature in the range of 700° C. to cause the planarization layer to expand according to a first thermal coefficient of expansion, the second layer to expand according to a second thermal coefficient of expansion, and the structural integrity of the barrier film to be maintained. This results in the barrier film isolating the planarization layer from the second layer, thereby preventing the planarization layer and the second layer from interacting during the heating step. Further, it enables the planarization layer to go through a solid state reaction and the second layer to obtain a uniform reflow.

Moreover, in order to achieve additional objects, a semiconductor device resistant to the effects of buckling is disclosed. The device comprises a first layer superjacent a semiconductor substrate and a barrier film positioned superjacent the substrate having a structural integrity. The first layer comprises tungsten, titanium, tantalum, copper, aluminum, single crystal silicon, polycrystalline silicon, amorphous silicon, borophosphosilicate glass ("BPSG") or tetraethylorthosilicate ("TEOS"). Furthermore, the barrier layer comprises titanium nitride, tantalum nitride, titanium oxide, tantalum oxide, silicon dioxide, silicon nitride or tetraethylorthosilicate ("TEOS"). Moreover, a second layer is positioned superjacent the barrier film, the second layer comprising tungsten, titanium, tantalum, copper, aluminum, single crystal silicon, polycrystalline silicon, amorphous silicon, borophosphosilicate glass ("BPSG") or tetraethylorthosilicate ("TEOS"). By employing the barrier film between the first and second layers, both first and second layers are isolated from each other when a temperature of at least 700° C. is applied, thereby preventing any interaction between the first layer and the second layer. This configuration additionally enables the first layer and the second layer to uniformly reflow during a heating step.

Other objects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE DRAWINGS

Figure 1:
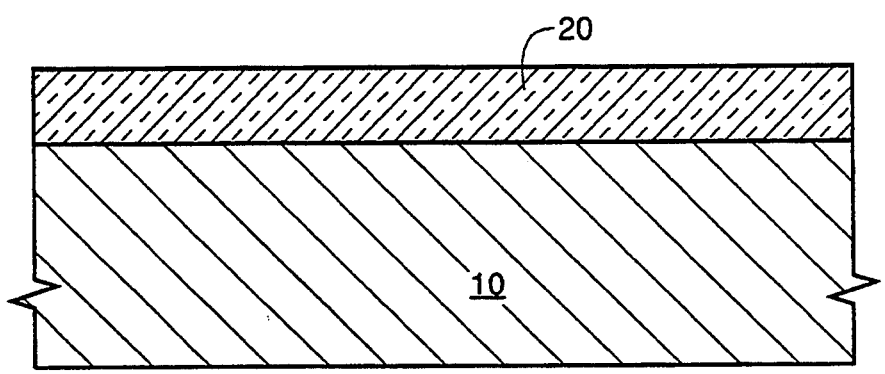
FIG. 1 is a cross-sectional view of a semiconductor substrate of the known art.
Figure 2:
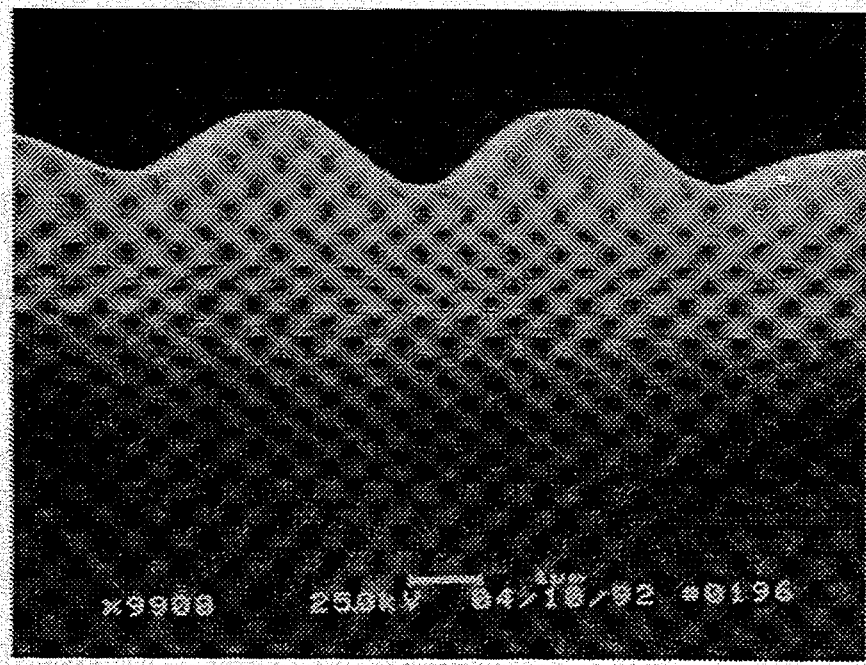
FIG. 2 is a cross-sectional view of a buckling semiconductor substrate.
Figure 3:
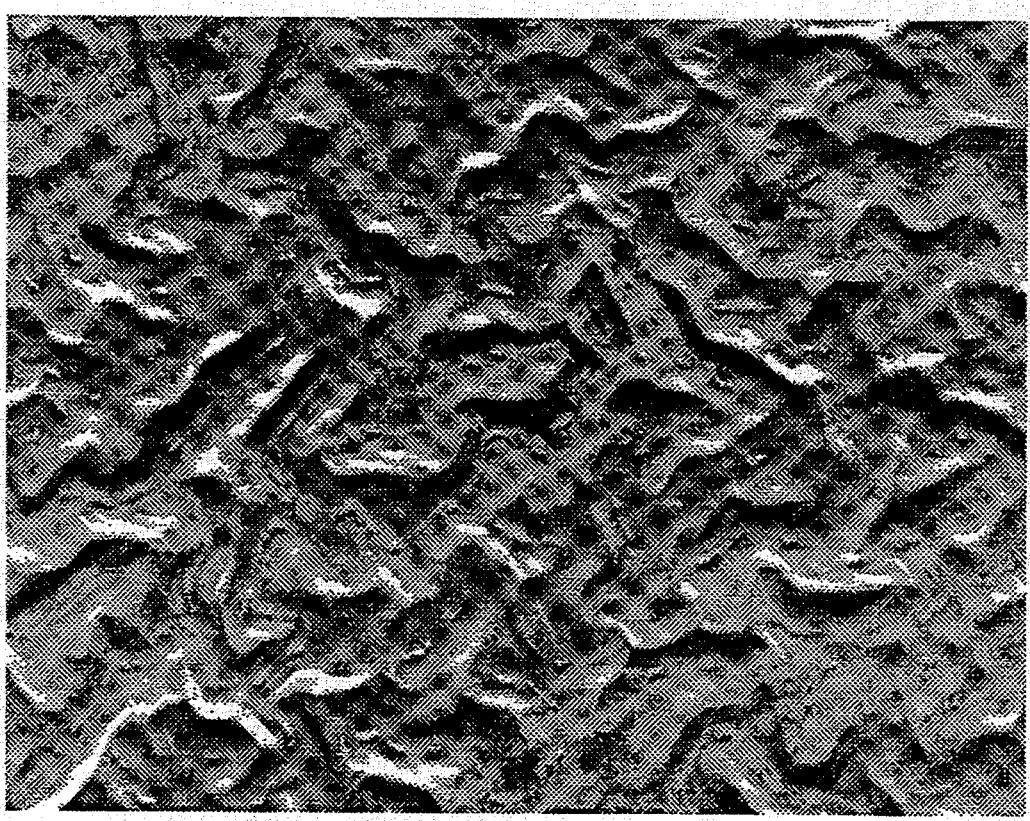
FIG. 3 is a top view of a buckling semiconductor substrate.
Figure 2:
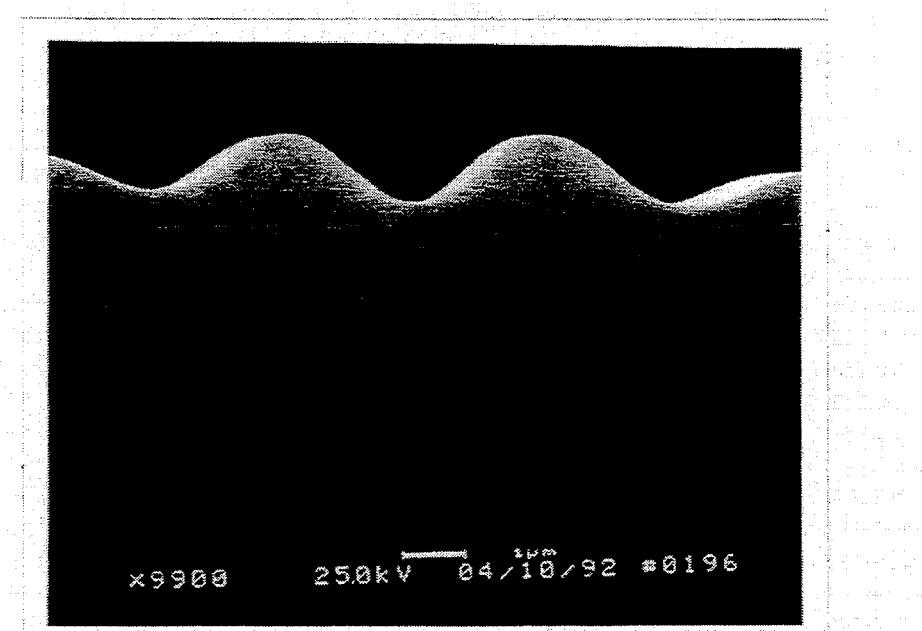
Figure 3:
Figure 4:
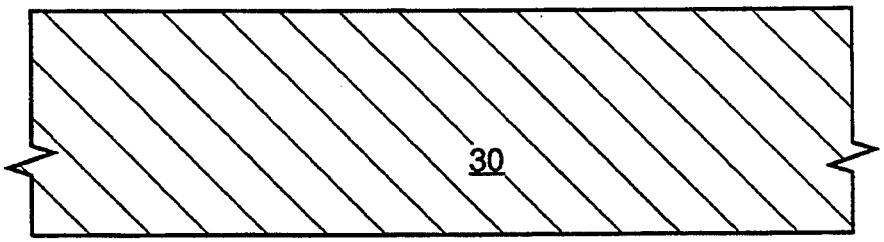
FIG. 4 is a cross-sectional view of a semiconductor substrate prior to undergoing the present inventive method.

Referring to FIG. 4, a first layer 30 is depicted within a chamber (not shown) prior to undergoing the present inventive method. First layer 30 can comprise a variety of materials and/or compounds, each having a specific thermal expansion coefficient. First layer 30 comprises tungsten, titanium, tantalum, copper, aluminum, single crystal silicon, polycrystalline silicon ("polysilicon"), amorphous silicon, or silicate glass—preferably either borophosphosilicate glass ("BPSG") or tetraethylorthosilicate ("TEOS").

Figure 5:
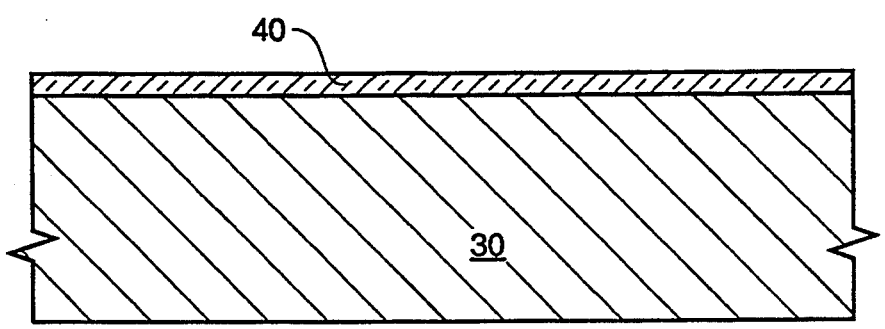
FIG. 5 is a cross-sectional view of a semiconductor substrate undergoing the first step of the present inventive method.

Referring to FIG. 5, a film 40 is formed superjacent first layer 30. Film 40 is formed preferably in situ under high vacuum utilizing Rapid Thermal Processing ("RTP") or Rapid Thermal Processing Chemical Vapor Deposition ("RTPCVD") principles. This is because both RTP and RTPCVD provide greater control of the formation of film 40. Nevertheless, it should be obvious to one of ordinary skill in the art that a variety of alternate approaches are known in the art for forming film 40, including Chemical Vapor Deposition ("CVD"), Rapid Thermal Processing Chemical Vapor Deposition ("RTPCVD"), Low Pressure Chemical Vapor Deposition ("LPCVD"), Molecular Beam Epitaxy ("MBE"), Reactive Ion Sputtering ("RIS"), Physical Vapor Deposition ("PVD") or Plasma Processing.

Relying on RTP or RTPCVD, first layer 30 is exposed to both a gas, such as $N_2$, $NH_3$, $O_2$, $N_2O$, $Ar$, $Ar$—$H_2$, $H_2$, $GeH_4$, or a Fluorine based gas, such as $NF_3$, and radiant energy. The gas employed is introduced into the chamber for approximately 5 seconds to 60 seconds at a flow rate substantially in the range of 50 sccm to 20,000 sccm. The radiant energy, generated by a light source, such as a lamp, produces heat within the range of 500° C. to 1250° C. As a result of this process step, film 40 forms superjacent first layer 30.

Structurally, film 40 can comprise titanium nitride (TIN), tantalum nitride, titanium oxide, tantalum oxide, silicon dioxide, silicon nitride or tetraethylorthosilicate ("TEOS"). The actual chemical makeup is dependent on the chemical composition of first layer 30, as well as the gas employed in the RTP or RTPCVD step. However, irrespective of its actual chemical composition, once formed, film 40 maintains its rigidity and structural integrity upon subsequent heating steps. This is because of the inherent, small coefficient of thermal expansion of film 40.

Figure 6:
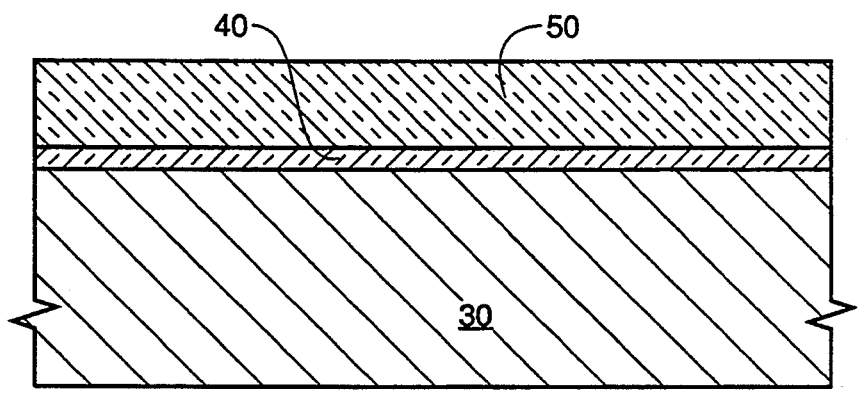
FIG. 6 is a cross-sectional view of a semiconductor substrate undergoing the second step of the present inventive method.

Referring to FIG. 6, a second layer 50 is formed superjacent film 40. Second layer 50 can comprise a variety of materials and/or compounds, each having a specific thermal expansion coefficient. Second layer 50 can be formed superjacent film 40 by a variety of techniques, such as Chemical Vapor Deposition ("CVD"), Rapid Thermal Processing Chemical Vapor Deposition ("RTPCVD"), Low Pressure Chemical Vapor Deposition ("LPCVD"), Molecular Beam Epitaxy ("MBE"), Reactive Ion Sputtering ("RIS"), Physical Vapor Deposition ("PVD") or Plasma Processing. Second layer 50 comprises tungsten, titanium, tantalum, copper, aluminum, single crystal silicon, polycrystalline silicon ("polysilicon"), amorphous silicon, or silicate glass—preferably either borophosphosilicate glass ("BPSG") or tetraethylorthosilicate ("TEOS").

Once second layer 50 is formed superjacent film 40, the entire device is then heated. By providing the heating step, both first layer 30 and second layer 50 will reflow according to their respective coefficients of thermal expansion. To this end, the heat generated must be at least 700° C. At this temperature, first layer 30 and second layer 50 both reflow and expand according to their respective coefficients of thermal expansion. However, because of its intrinsic properties, film 40 maintains its structural integrity. Thus, any buckling effects are substantially minimized, as both first layer 30 and second layer 50 substantially uniformly reflow by the impact of film 40 in light of its support characteristics. Moreover, by its position between first layer 30 and second layer 50, film 40 acts as a barrier thereby preventing first layer 30 and second layer 50 from interacting during the heating step.

Figure 7:
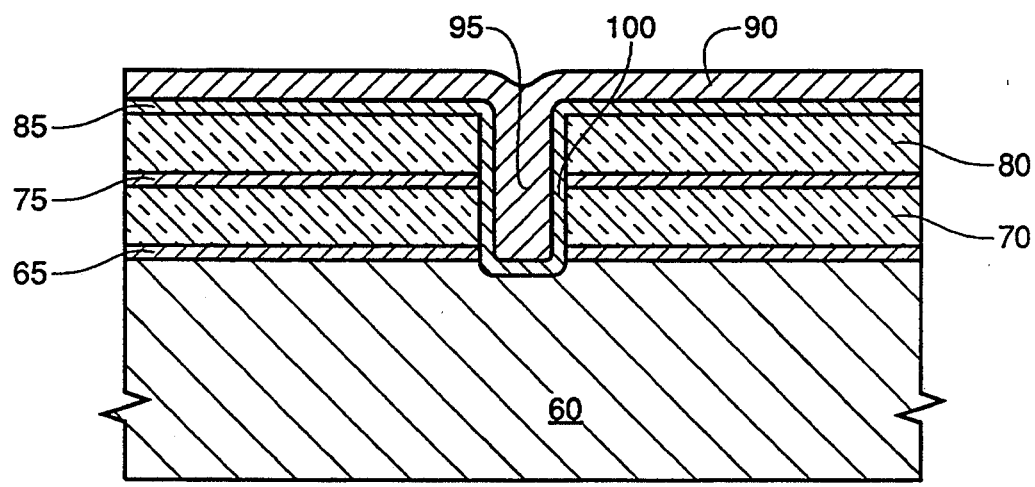
FIG. 7 is a cross-sectional view of an alternate embodiment of the present invention.

Referring to FIG. 7, a cross-sectional view of a semiconductor device employing the present invention is illustrated. In the previous embodiment, the phenomenon of buckling was considered in solely one direction. Nonetheless, more complex structures also require some form of protection against buckling. In FIG. 7, a semiconductor substrate 60 is depicted comprising a barrier film 65 directly superjacent. Barrier film 65 comprises titanium nitride, tantalum nitride, titanium oxide, tantalum oxide, silicon dioxide, silicon nitride or tetraethylorthosilicate ("TEOS"). Superjacent barrier film 65 is a first layer 70, and superjacent first layer 70 is a second barrier film 75. Moreover, superjacent second barrier film 75 is an intermediate layer 80, and superjacent intermediate layer 80 is a third barrier film 85. Further, a top layer 90 is positioned superjacent third barrier film 85.

Within each of the hereinabove layers, 70 and 80, and films, 65, 75, and 85, is a void through which a plug 95 is ultimately positioned. A contact hole 100 is formed by lining the void with third barrier film 85. When the heating step is subsequently performed to this structural configuration, the lining portion of barrier film 85 maintains its structural rigidity and integrity. Thus, while the layers involved may have different coefficients of expansion, any lateral buckling in first layer 70 and intermediate layer 80 is prevented in the contact hole 100 by means of barrier film 85. As such, when plug 95 is properly positioned in association with contact hole 100, a true contact is made.

In light of the present inventive method, a semiconductor device which is resistant to the effects of buckling can be fabricated. This device is configured such that a first layer is positioned superjacent a semiconductor substrate. Further, a barrier film is positioned superjacent the substrate. The barrier film, being rigid and having a structural integrity, comprises titanium nitride, tantalum nitride, titanium oxide, tantalum oxide, silicon dioxide or tetraethylorthosilicate ("TEOS"). Further, a second layer is positioned superjacent the barrier film to isolate both first and second layers from interacting at temperature of at least 700° C., as well as enable both first and second layers to reflow uniformly. It should be noted that, as before, first and second layers can comprise tungsten, titanium, tantalum, copper, aluminum, single crystal silicon, polycrystalline silicon, amorphous silicon or silicate glass, such as borophosphosilicate glass ("BPSG") or tetraethylorthosilicate ("TEOS"). Nonetheless, it should be obvious to one of ordinary skill in the art that alternate materials and/or compounds may employed to any aspect of the present invention to prevent the effects of buckling.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

What is claimed is:

1. A method for fabricating a semiconductor wafer, comprising the steps of:
    a) forming a first layer superjacent a semiconductor substrate, said first layer comprising a dielectric;
    b) forming a film superjacent said first layer, said film having a structural integrity, said film comprising a nitride;
    c) forming a second layer superjacent said film, said second layer comprising a metal; and
    d) heating said substrate to cause said first layer and said second layer to uniformly reflow, thereby minimizing buckling.

2. A method for fabricating a semiconductor wafer, according to claim 1, wherein said heating comprises the steps of:
    expanding said first layer according to a first thermal coefficient;
    expanding said second layer according to a second thermal coefficient; and
    maintaining said structural integrity of said film, thereby enabling said first and said second layers to reflow uniformly.

3. A method for fabricating a semiconductor wafer, according to claim 2, wherein said film isolates said first layer from said second layer, thereby preventing said first layer and said second layer from interacting during said heating step.

4. A method for fabricating a semiconductor wafer, according to claim 2, wherein said heating step is at least at a temperature of 700° C.

5. A method for fabricating a semiconductor wafer, according to claim 2, wherein said forming a film comprises the step of:
    exposing said substrate to a gas and radiant energy.

6. A method for fabricating a semiconductor wafer, according to claim 5, wherein said gas comprises at least one of $N_2$, $NH_3$, $O_2$, $N_2O$, Ar, Ar—$H_2$, $H_2$, $GeH_4$, and a Fluorine based gas.

7. A method for fabricating a semiconductor wafer, according to claim 6, wherein said radiant energy generates heat within the range of 500° C. to 1250° C. and said substrate is exposed to said gas for 5 seconds to 60 seconds at a flow rate in the range of 50 sccm to 20,000 sccm.

8. A method for fabricating a semiconductor wafer, according to claim 5, wherein said film comprises at least one of titanium nitride, tantalum nitride, titanium oxide, tantalum oxide, silicon dioxide, silicon nitride and tetraethylorthosilicate ("TEOS").

9. A method for fabricating a semiconductor wafer, according to claim 8, wherein said first layer comprises at least one of tungsten, titanium, tantalum, copper, aluminum, single crystal silicon, polycrystalline silicon, amorphous silicon, borophosphosilicate glass ("BPSG") and tetraethylorthosilicate ("TEOS").

10. A method for fabricating a semiconductor wafer, according to claim 8, wherein said second layer comprises at least one of tungsten, titanium, tantalum, copper, and aluminum.

11. A method for reducing the effects of buckling in fabricating a semiconductor wafer, comprising the steps of:
    a. forming a planarization layer superjacent a semiconductor substrate;
    b. forming a barrier film superjacent said planarization layer, said barrier film having a structural integrity, said barrier film comprising a dielectric;
    c. forming a second layer superjacent said barrier film, said second layer comprises metal; and
    d. heating said substrate to cause said planarization layer to expand according to a first thermal coefficient of expansion, said second layer to expand according to a second thermal coefficient of expansion, while said structural integrity of said barrier film is maintained, thereby enabling said planarization layer and said second layer to uniformly reflow.

12. A method for fabricating a semiconductor wafer, according to claim 11, wherein said barrier film isolates said planarization layer from said second layer, thereby preventing said planarization layer and said second layer from interacting during said heating step.

13. A method for fabricating a semiconductor wafer, according to claim 11, wherein said heating of said substrate is at least at a temperature of 700° C.

14. A method for fabricating a semiconductor wafer, according to claim 11, wherein said forming a barrier film comprises the step of:

exposing said substrate to a gas and radiant energy, said gas comprising at least one of $N_2$, $NH_3$, $O_2$, $N_2O$, Ar, Ar—$H_2$, $H_2$, $GeH_4$, and a Fluorine based gas, said radiant energy generating heat within the range of 500° C. to 1250° C.

15. A method for fabricating a semiconductor wafer, according to claim 11, wherein said barrier film comprises at least one of titanium nitride, tantalum nitride, titanium oxide, tantalum oxide, silicon dioxide, silicon nitride and tetraethylorthosilicate ("TEOS").

16. A method for fabricating a semiconductor wafer, according to claim 15, wherein said planarization layer comprises at least one of tungsten, titanium, tantalum, copper, aluminum, single crystal silicon, polycrystalline silicon, amorphous silicon, borophosphosilicate glass ("BPSG") and tetraethylorthosilicate ("TEOS").

17. A method for fabricating a semiconductor wafer, according to claim 16, wherein said second layer comprises at least one of tungsten, titanium, tantalum, copper, and aluminum.

18. A method for fabricating semiconductor wafers resistant to the effects of buckling, comprising the steps of:

a. forming a planarization layer superjacent a semiconductor substrate, said planarization layer comprising at least one of tungsten, titanium, tantalum, copper, aluminum, single crystal silicon, polycrystalline silicon, amorphous silicon, borophosphosilicate glass ("BPSG") and tetraethylorthosilicate ("TEOS");

b. forming a barrier film having a structural integrity superjacent said planarization layer by exposing said substrate to a gas and radiant energy, said gas comprising at least one of $NH_3$, $O_2$, $N_2O$, Ar, Ar—$H_2$, $H_2$, $GeH_4$, and a Fluorine based gas, said radiant energy generating heat within the range of 500° C. to 1250° C., said barrier film comprising nitride;

c. forming another layer superjacent said barrier film, said another layer comprising at least one of tungsten, titanium, tantalum, copper, aluminum, borophosphosilicate glass ("BPSG") and tetraethylorthosilicate ("TEOS");

d. heating said substrate sufficiently to at least at a temperature of 700° C. to cause said planarization layer to expand according to a first thermal coefficient of expansion, said another layer to expand according to a second thermal coefficient of expansion, and said structural integrity of said barrier film to be maintained, said barrier film isolating said planarization layer from said another layer, thereby preventing said planarization layer and said another layer from interacting during said heating, and enabling said planarization layer and said another layer to reflow uniformly.

* * * * *